(12) United States Patent
Choong et al.

(10) Patent No.: US 8,729,654 B2
(45) Date of Patent: May 20, 2014

(54) BACK-SIDE READOUT SEMICONDUCTOR PHOTOMULTIPLIER

(71) Applicant: The Regents of the University of California, Oakland, CA (US)

(72) Inventors: Woon-Seng Choong, Oakland, CA (US); Stephen E. Holland, Hercules, CA (US)

(73) Assignee: The Regents of the University of California, Oakland, CA (US)

( * ) Notice: Subject to any disclaimer, the term of this patent is extended or adjusted under 35 U.S.C. 154(b) by 12 days.

(21) Appl. No.: 13/652,238

(22) Filed: Oct. 15, 2012

(65) Prior Publication Data
US 2013/0099346 A1 Apr. 25, 2013

Related U.S. Application Data

(60) Provisional application No. 61/550,163, filed on Oct. 21, 2011.

(51) Int. Cl.
*H01L 21/02* (2006.01)
(52) U.S. Cl.
USPC .................................. 257/437; 257/E31.119
(58) Field of Classification Search
USPC ........... 257/437, 431, 443, E31.119, E31.113
See application file for complete search history.

(56) References Cited

U.S. PATENT DOCUMENTS

2013/0099346 A1* 4/2013 Choong et al. ................ 257/437

FOREIGN PATENT DOCUMENTS

WO PCT/EP2011/054475 9/2011

OTHER PUBLICATIONS

Z. Y. Sadygov, I. M. Zheleznykh, N. A. Malakhov, V. N. Jejer, and T. A. Kirillova, "Avalanche semiconductor radiation detectors," IEEE Trans. Nucl. Sci., vol. 43, No. 3, pp. 1009-1013, Jun. 1996.
P. Buzhan, B. Dolgoshein, A. Ilyin, V. Kantserov, V. Kaplin, A. Karakash, A. Pleshko, E. Popova, S. Smirnov, and Y. Volkov, "An advanced study of silicon photomultiplier," ICFA Instrum. Bull., vol. 23, 2001.
V. Saveliev, "The recent development and study of silicon photomultiplier," Nucl. Instrum. Methods Phys. Res. A, vol. 535, pp. 528-532, 2004.
C. J. Stapels, W. G. Lawrence, F. L. Augustine, and J. F. Christian, "Characterization of a CMOS Geiger photodiode pixel," IEEE Trans. Electron Devices, vol. 53, No. 4, pp. 631-635, Apr. 2006.

(Continued)

*Primary Examiner* — Mark Prenty
(74) *Attorney, Agent, or Firm* — Lawrence Berkeley National Laboratory

(57) ABSTRACT

This disclosure provides systems, methods, and apparatus related to semiconductor photomultipliers. In one aspect, a device includes a p-type semiconductor substrate, the p-type semiconductor substrate having a first side and a second side, the first side of the p-type semiconductor substrate defining a recess, and the second side of the p-type semiconductor substrate being doped with n-type ions. A conductive material is disposed in the recess. A p-type epitaxial layer is disposed on the second side of the p-type semiconductor substrate. The p-type epitaxial layer includes a first region proximate the p-type semiconductor substrate, the first region being implanted with p-type ions at a higher doping level than the p-type epitaxial layer, and a second region disposed on the first region, the second region being doped with p-type ions at a higher doping level than the first region.

18 Claims, 9 Drawing Sheets

(56) References Cited

OTHER PUBLICATIONS

Y. Musienko, "Advances in multipixel Geiger-mode avalanche photodiodes (silicon photomultipliers)," Nucl. Instrum. Methods Phys. Res. A, vol. 598, pp. 213-216, 2009.
T. Frach, G. Prescher, C. Degenhardt, R. de Gruyter, A. Schmitz, and R. Ballizany, "The digital silicon photomultiplier—Principle of operation and intrinsic detector performance," in Proc. IEEE Nucl. Sci. Symp. Conf. Rec., 2009, pp. 1959-1965.
G. Q. Zhang, X. B. Hu, C. Z. Hu, D. P. Yin, K. Liang, R. Yang, and D. J. Han, "Demonstration of a silicon photomultiplier with bulk integrated quenching resistors on epitaxial silicon," Nucl. Instrum. Methods Phys. Res. A, vol. 621, No. 1-3, pp. 116-120, Sep. 2010.
J. Ninkovic, L. Andricek, C. Jendrisyk, G. Liemann, G. Lutz, H.-G. Moser, R. Richter, and F. Schopper, "The first measurements on SiPMs with bulk integrated quench resistors," Nucl. Instrum. Methods Phys. Res. A, vol. 628, No. 1, pp. 407-410, Feb. 2011.
G. Pellegrini, M. Lozano, M. Ullan, R. Bates, C. Fleta, and D. Pennicard, "First double-sided 3-D detectors fabricated at CNM-IMB," Nucl. Instrum. Methods Phys. Res. A, vol. 592, No. 1/2, pp. 38-43, Jul. 2008.
R. H. Richter, "Strip detector design for ATLAS and HERA-B using two dimensional device simulation," Nucl. Instrum. Methods Phys. Res. A, vol. 377, No. 2/3, pp. 412-421, Aug. 1996.
Choong, et al., "Back-Side Readout Silicon Photomultiplier," IEEE Trans. Electron Devices, vol. 59, No. 8, pp. 2187-2191, Aug. 2012.
Y. Iwata, "Optimal p-stop pattern for the n-side strip isolation of silicon microstrip detectors," IEEE Trans. Nucl. Sci., vol. 45, No. 3, pp. 303-309, Jun. 1998.
N. Serra, G. Giacomini, A. Piazza, C. Piemonte, A. Tarolli, and N. Zorzi, "Experimental and TCAD study of breakdown voltage temperature behavior in n+/p SiPMs," IEEE Trans. Nucl. Sci., vol. 58, No. 3, pp. 1233-1240, Jun. 2011.
W. G. Oldham, R. R. Samuelson, and P. Antognetti, "Triggering phenomena in avalanche diodes," IEEE Trans. Electron Devices, vol. ED-19, No. 9, pp. 1056-1060, Sep. 1972.
A. Lacaita, F. Zappa, S. Bigliardi, and M. Manfredi, "On the bremsstrahlung origin of hot-carrier-induced photons in silicon devices," IEEE Trans. Electron Devices, vol. 40, No. 3, pp. 577-582, Mar. 1993.
R. Mirzoyan, R. Kosyra, and H.-G. Moser, "Light emission in Si avalanches," Nucl. Instrum. Methods Phys. Res. A, vol. 610, No. 1, pp. 98-100, 2009.
M. Gersbach, J. Richardson, E. Mazaleyrat, S. Hardillier, C. Niclass, R. Henderson, L. Grant, and E. Charbon, "A low-noise single-photon detector implemented in a 130 nm CMOS imaging process," Solid State Electron., vol. 53, No. 7, pp. 803-808, Jul. 2009.
J.-F. Pratte, M.-A. Tetrault, B.-L. Berube, A. Corbeil Therrien, V.-P. Rheaume, A. Boisvert, E. Desaulniers Lamy, S. A. Charlebois, R. Fontaine, "Toward the Realization of 3D Single Photon Counting Modules for Radiation Instrumentation," Abstract of presentation given Nov. 1, 2012 at the 2012 Nuclear Science Symposium and Medical Imaging Conference.

\* cited by examiner

US 8,729,654 B2

BACK-SIDE READOUT SEMICONDUCTOR PHOTOMULTIPLIER

STATEMENT OF GOVERNMENT SUPPORT

This invention was made with government support under Contract No. DE-AC02-05CH11231 awarded by the U.S. Department of Energy and Contract No. R21EB007081 awarded by the National Institutes of Health. The government has certain rights in this invention.

RELATED APPLICATIONS

This application claims priority under 35 U.S.C §119(e) to U.S. Provisional Patent Application No. 61/550,163, filed Oct. 21, 2011, which is herein incorporated by reference,

FIELD

This disclosure relates generally to the field of semiconductor sensors, and more particularly relates to back-side readout semiconductor photomultipliers.

BACKGROUND

A recent development in the design of solid-state photodetectors is the silicon photomultiplier (SiPM) [1]-[5], which is capable of single-photon detection and operation inside magnetic fields. SiPMs have been considered as an alternative to photomultiplier tubes in many applications ranging from radionuclide imaging in single-photon emission computed tomography (SPECT) and positron emission tomography (PET) to particle physics, nuclear physics, and astrophysics. SiPMs are also known by many other names: metalresistor-semiconductor APD, micropixel APD, multipixel photon counter, Geiger-mode APD, solid-state photomultiplier, etc. Many research groups and commercial manufacturers have developed specific configurations of SiPMs.

A SiPM is a large number of small identical avalanche photodiodes (APDs) (cells or microcells) operating in Geiger mode arranged in a matrix. A microcell of a SiPM has dimensions typically ranging from about 10 microns to 100 microns. Each microcell operates as an independent photon counter in Geiger mode; the operating voltage is biased about 5% to 20% above the breakdown voltage. A photon impinging on one microcell can create free carriers that can give rise to a Geiger-mode discharge. This discharge is quenched when the microcell's voltage drops below the breakdown voltage when the discharge current passes through an integrated quenching resistor. The microcell is a binary device since the signal from a microcell has approximately the same shape and amplitude. The discharge currents from all microcells are added on a common load resistor; therefore, the output signal of a SiPM is the sum of the signals from all the microcells firing at the same time.

Key features of SiPMs include high gain ($10^5$ to $10^6$), low bias voltage (<100 V), insensitivity to magnetic fields, good timing resolution, and low power consumption. Further, SiPMs can be fabricated using complementary metal-oxide-semiconductor (CMOS) technology, which can potentially reduce the cost of these devices.

SUMMARY

The systems, methods, and devices of this disclosure each have several innovative aspects, no single one of which is solely responsible for the desirable attributes disclosed herein.

Disclosed herein are embodiments of a semiconductor photomultiplier (PM) that increase the fill factor and, consequently, the photon detection efficiency (PDE), by bringing the electronic signal from each microcell of the semiconductor PM to the back side of the semiconductor PM structure. In addition, active or passive components can be fabricated on the back side of the structure without affecting the active area of the microcells on the front side where the incident photons are impinging. Since the electronic signals from the microcells are brought out to the back side, they can also be coupled to an application-specific integrated circuit (ASIC) for signal processing.

One innovative aspect of the subject matter described in this disclosure can be implemented in an device including a p-type semiconductor substrate, the p-type semiconductor substrate having a first side and a second side, the first side of the p-type semiconductor substrate defining a recess, and the second side of the p-type semiconductor substrate being doped with n-type ions. A conductive material is disposed in the recess. A p-type epitaxial layer is disposed on the second side of the p-type semiconductor substrate. The p-type epitaxial layer includes a first region proximate the p-type semiconductor substrate, the first region being implanted with p-type ions at a higher doping level than the p-type epitaxial layer, and a second region disposed on the first region, the second region being doped with p-type ions at a higher doping level than the first region.

In another aspect, a device includes a n-type semiconductor substrate, the n-type semiconductor substrate having a first side and a second side, the first side of the n-type semiconductor substrate defining a recess, and the second side of the n-type semiconductor substrate being implanted with p-type ions. A conductive material is disposed in the recess. A n-type epitaxial layer is disposed on the second side of the n-type semiconductor substrate, the n-type epitaxial layer including a first region proximate the n-type semiconductor substrate, the first region being implanted with p-type ions, and a second region disposed on the first region, the second region being implanted with n-type ions.

In another aspect, an apparatus includes a first device and an application-specific integrated circuit. The first device includes a p-type semiconductor substrate, the p-type semiconductor substrate having a first side and a second side, the first side of the p-type semiconductor substrate defining a recess, and the second side of the p-type semiconductor substrate being implanted with n-type ions. A conductive material is disposed in the recess. A p-type epitaxial layer is disposed on the second side of the p-type semiconductor substrate, the p-type epitaxial layer including a first region proximate the p-type semiconductor substrate, the first region being implanted with p-type ions at a higher doping level than the p-type epitaxial layer, and a second region disposed on the first region, the second region being implanted with p-type ions at a higher doping level than the first region. The application-specific integrated circuit is coupled to the first side of the p-type semiconductor substrate and in electrical contact with the conductive material of the first device.

DETAILED DESCRIPTION

A recent development in SiPMs includes combining an electronics block next to each microcell to detect the photons. This electronics block may contain active quenching and recharge circuitry, a 1-b memory to enable and disable the corresponding microcell, and trigger signals to on-chip time-to-digital converter and counter [6].

One drawback of current designs of SiPMs, however, is that the signals are read out from the front side of the device. Quenching resistive structures fabricated on the front surface of the device often reduce the active area for photon detection. In addition, any other components (active or passive) fabricated on this front surface would limit the active area. Generally, current SiRMs with small microcell sizes have a relatively small fill factor (the fraction of total area occupied by the active microcell areas), which reduces the photon detection efficiency (PDE). The PDE of SiPMs is given by the product of the quantum efficiency (QE), the geometric fill factor, and the probability of an incoming photon triggering a breakdown.

SiPMs with integrated bulk quenching resistors have been developed to improve their fill factor [7], [8]. Since there are no polysilicon resistors or metal lines on the front side, the active area for photon detection is increased. However, the signals are still added on a continuous electrode common to all microcells and read out on the front side.

Disclosed herein are embodiments of a back-side readout semiconductor photomultiplier (PM), configured to provide signal from each microcell on the back side, allowing for a large fill factor for light detection on the front side. The configuration of the back-side readout semiconductor PM allows for a fill factor greater than 90% for a microcell area larger than about 40 microns by 40 microns, without trenches. Another advantage of the back-side readout semiconductor PM is that it allows passive and/or active circuitries to be implemented on the hack side or on a separate application-specific integrated circuit (ASIC) for signal processing (analog and/or digital) without affecting the PDE. Each microcell can be bump bonded to an ASIC with matching pads for signal processing. The design has natural dark count rate and crosstalk suppression from carriers generated in the bulk. In addition, trenches can be added to further reduce the crosstalk between microcells in the avalanche region. The semiconductor PMs disclosed herein are further described in the publication W-S Choong and S. E. Holland, "Back-Side Readout Silicon Photomultiplier," *IEEE Trans. Electron Devices*, vol. 59, no. 8, pp. 2187-2191, August 2012, which is herein incorporated by reference.

Figure 1:
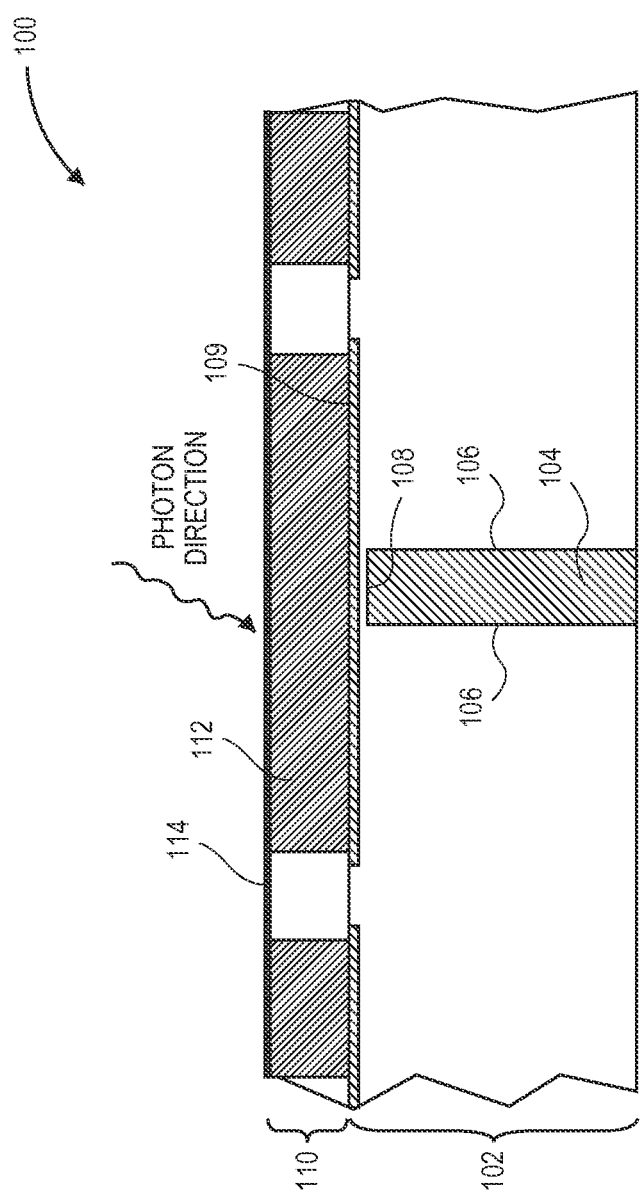
FIG. 1 shows an example of a cross-sectional schematic illustration of a cell of a back-side readout semiconductor PM with a p-type semiconductor substrate.

FIG. 1 shows an example of a cross-sectional schematic illustration of a cell of a back-side readout semiconductor PM. The cell 100 includes a p-type semiconductor substrate 102. A first side of the p-type semiconductor substrate 102 includes a recess with a conductive material 104 filling the recess. A region of a second side of the p-type semiconductor substrate 102 is doped with n-type ions by ion implantation or diffusion, forming a n-doped region 109. When the semiconductor substrate is doped by diffusion, the source for the diffusion may be a solid, a liquid, or a gas. Diffusion is normally performed at high temperatures, at about 700° C. to 1200° C., for example. In some embodiments, the p-type semiconductor substrate 102 may be about 20 microns to 600 microns thick or about 50 microns to 300 microns thick. In some embodiments, the p-type semiconductor substrate 102 may include a silicon substrate or a gallium arsenide substrate.

The cell 100 further includes a p-type epitaxial layer 110 disposed on the second side of the p-type semiconductor substrate 102. The p-type epitaxial layer 110 includes a first region 112, doped with p-type ions at a higher doping level than the p-type epitaxial layer, with the first region 112 being proximate the p-type semiconductor substrate 102. The n-doped region 109 of the p-type semiconductor substrate 102 and the first region 112 of the p-type epitaxial layer 110 form a p-n junction. The thickness of the p-type region (i.e., the first region 112 of the p-type epitaxial layer 110) of the p-n junction is configured to absorb as many of the incident photons as possible.

The p-type epitaxial layer 110 also includes a second region 114 disposed on the first region 112. The second region 114 is implanted with p-type ions continuously over all microcells to serve as a contact. In some implementations, the second region 114 may be a layer of heavily-doped p-type semiconductor that is deposited on the p-type epitaxial layer 110. In some implementations, the second region 114 may be a layer of material that is deposited. The second region 114 on the p-type epitaxial layer 110 does not include metal lines or other features within the active area of the cell 100. In some embodiments, the p-type epitaxial layer 110 may be about 1 micron to 5 microns thick. In some embodiments, the p-type epitaxial layer 110 may include silicon or gallium arsenide.

The recess defined by the p-type semiconductor substrate 102 may have a rectangular, hexagonal, octagonal, or circular cross section, giving the recess a columnar shape. In some embodiments, the diameter of the recess, and the conductive material filling the recess, may be less than about 1 micron, about 1 micron to 5 microns, or about 5 microns to 100 microns. In some embodiments, the recess may have an aspect ratio of about 1 to 30 or greater.

In some embodiments, the conductive material 104 filling the recess may include a heavily-doped n-type semiconductor. For example, in some embodiments, the entire recess may be filled with heavily-doped n-type silicon and n-type dopants may be subsequently diffused into the walls of the recess. In some embodiments, the walls of the recess can be doped with n-type dopant by depositing a layer (e.g., about 1 micron to 5 microns thick) of heavily-doped n-type semiconductor (e.g., polysilicon, in the case where a silicon substrate is used, or polycrystalline gallium arsenide, in the case where a gallium arsenide substrate is used) or by diffusion of n-type dopant in the walls of the recess. The unfilled portion of the recess can then be filled with more doped or undoped semiconductor (e.g., polysilicon, in the case where a silicon substrate is used, or polycrystalline gallium arsenide, in the case where a gallium arsenide substrate is used) or an insulator (e.g., silicon oxide). In some embodiments, diffusion of the n-type dopant in the recess walls 106 and 108 will invert the p-type region between the bottom 108 of the recess and the n-doped region 109 into n-type, thereby electrically connecting the n-doped region 109 to the conductive material included in the recess. In addition, diffusing the n-type dopant in the walls of the recess creates a depletion region between the recess and the substrate in addition to the depletion region in the epitaxial layer, thereby electrically isolating the individual microcell.

In some embodiments, the conductive material 104 filling the recess may include a metal. Examples of metals that may be used include copper, aluminum, and tungsten. When the conductive material 104 includes a metal, sides 106 of the recess in the p-type semiconductor substrate 102 may have an electrically insulating material (not shown), such as silicon dioxide, disposed on the sides 106 of the recess. That is, the electrically insulating material may be disposed on surfaces of the recess that are substantially perpendicular to the first surface of the p-type semiconductor substrate 102. The bottom 108 of the recess, however, may not include any electrically insulating material. The electrically insulating material on the sides 106 of the recess may be about 0.01 micron to 1 micron thick.

Further, the recess defined by the p-type semiconductor substrate 102 includes a portion of the p-type semiconductor substrate 102 between the bottom 108 of the recess and the second side of the p-type semiconductor substrate 102. That is, the recess does not pass through the p-type semiconductor substrate 102. When the recess is filled with the conductive material 104, the portion of the p-type semiconductor exists between the top of the conductive material 104 and the second side of the p-type semiconductor substrate 102. The thickness of this portion of the p-type semiconductor substrate 102 may be about 0.2 microns to 10 microns thick.

In a method of fabricating a cell of a back-side readout semiconductor PM, the recess may be etched in the p-type semiconductor substrate using a dry etching process or a combination of dry and wet etching processes. For example, the dry etching process may include an inductively coupled plasma etching process [10], [11]. After etching the recess in the p-type semiconductor substrate, the recess may be filled with a heavily-doped n-type semiconductor. The p-type semiconductor substrate may then be annealed During the anneal processes, the dopants may diffuse out of the heavily-doped n-type semiconductor filling the recess and into the p-type semiconductor substrate. The portion of the p-type semiconductor substrate between the top of the heavily-doped n-type semiconductor and second side of the p-type semiconductor substrate, which includes a region doped with n-type ions (i.e., the n-doped region of the p-type semiconductor substrate), may be of a thickness such that: 1) a distance between the top of the heavily-doped n-type semiconductor in the recess and the n-doped region of the p-type semiconductor substrate is not depleted, in order to maintain an electrical connection between the two; and 2) the doping profile across the p-n junction in the cell is not affected. In some embodiments, the anneal process may round the top edges of the top of the heavily-doped n-type semiconductor in the recess, resulting in relatively large radius of curvature, which may reduce the field at the edges compared to a sharp edge.

During operation of cell 100, a photon impinging on the cell 100 may generate electrons in the first region 112 of the p-type epitaxial layer 110. The photo-generated electrons in the first region 112 propagate to the p-n junction where the high electric field region initiates an avalanche discharge. The n-doped region 109 of the p-type semiconductor substrate 102 serves as an anode of the cell 100, and the second region 114 of the p-type epitaxial layer 110 serves as an ohmic contact. In some embodiments, the conductive material filling the recess serves as an electrode. In some other embodiments, there may be a sheath of conductive material, created by dopant diffusion, surrounding the conductive material deposited in the recess. An electronic signal will be generated in the conductive material and subsequently brought to the back side of the cell 100 (i.e., to the first side of the p-type semiconductor substrate 102), through the conductive material. In some embodiments, the first side of the p-type semiconductor substrate 102 may further include a metal pad (not shown), in electrical contact with the conductive material 104. The metal pad may be used to attach the cell 100 to an ASIC, as described with respect to FIG. 5. In some other embodiments, active and/or passive components may be fabricated on the first side of the p-type semiconductor substrate 102.

Further, some embodiments of the cell 100 may include an antireflective layer (not shown) disposed on the p-type epitaxial layer 110. In some embodiments, the antireflective layer may include indium tin oxide (ITO).

Figure 2:
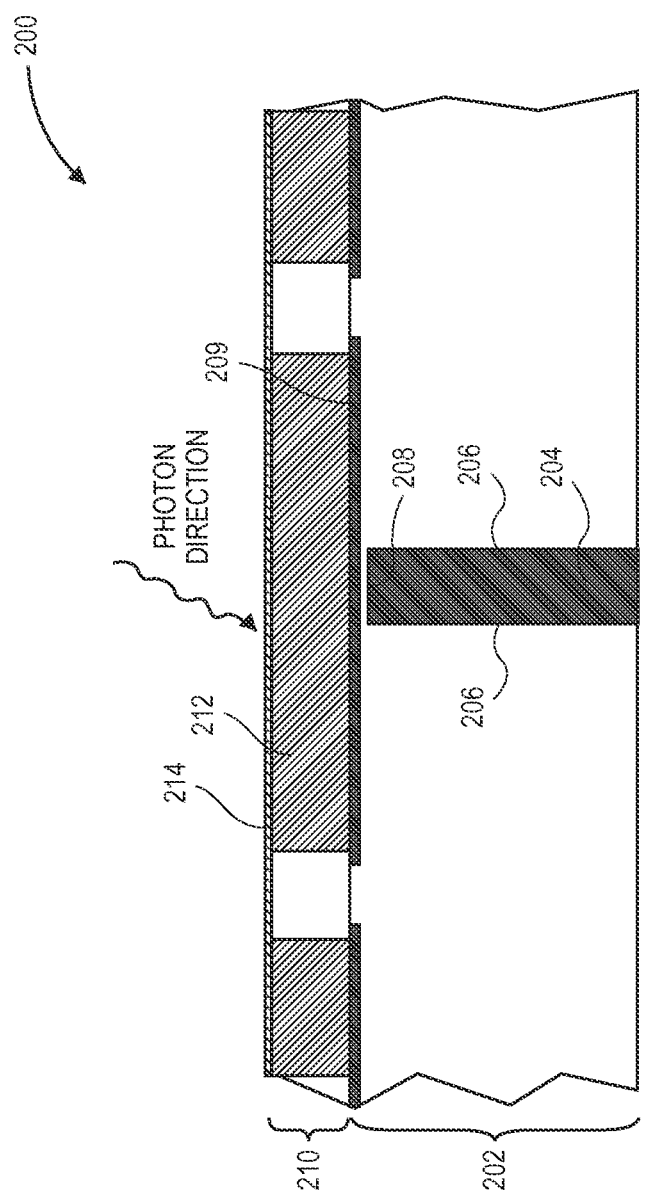
FIG. 2 shows an example of a cross-sectional schematic illustration of a cell of a back-side readout semiconductor PM with a n-type semiconductor substrate.

FIG. 2 shows an example of a cross-sectional schematic illustration of a cell of a back-side readout semiconductor PM with a n-type semiconductor substrate. The cell 200 shown in FIG. 2 may be similar to the cell 100 shown in FIG. 1, except with different doping in different components and regions of the cell 200. The cell 200 includes a n-type semiconductor substrate 202. A first side of the n-type semiconductor substrate 202 includes a recess with a conductive material 204 filling the recess. A region of a second side of the n-type semiconductor substrate 202 is implanted with p-type ions, forming a p-doped region 209. In some embodiments, the n-type semiconductor substrate 202 may be about 20 microns to 600 microns thick. In some embodiments, the n-type semiconductor substrate 202 may include a silicon substrate or a gallium arsenide substrate.

The cell 200 further includes a n-type epitaxial layer 210 disposed on the second side of the n-type semiconductor substrate 202. The n-type epitaxial layer 210 includes a first region 212, doped with p-type ions, proximate the n-type semiconductor substrate 202. The n-type epitaxial layer 210 also includes a second region 214 disposed on the first region 212. The second region 214 is implanted with n-type ions continuously over all microcells to serve as a contact. In some implementations, the second region 214 may be a layer of heavily-doped n-type semiconductor that is deposited on the n-type epitaxial layer 210. In some embodiments, the n-type epitaxial layer 210 may be about 1 micron to 5 microns thick. In some embodiments, then-type epitaxial layer 210 may include silicon or gallium arsenide.

In some embodiments, the conductive material 204 filling the recess may include a heavily-doped p-type semiconductor. For example, in some embodiments, the entire recess may be filled with heavily-doped p-type silicon and p-type dopants may be subsequently diffused into the walls of the recess. In some embodiments, the walls of the recess can be doped with p-type dopant by depositing a layer (e.g., about 1 micron to 5 microns thick) of heavily-doped p-type semiconductor (e.g., polysilicon, in the case where a silicon substrate is used, or polycrystalline gallium arsenide, in the case where a gallium arsenide substrate is used) or by diffusion of p-type dopant in the walls of the recess. The unfilled portion of the recess can then be filled with more doped or undoped semiconductor (e.g., polysilicon, in the case where a silicon substrate is used, or polycrystalline gallium arsenide, in the case where a gallium arsenide substrate is used) Or an insulator (e.g., oxide). In some embodiments, diffusion of the p-type dopant on the recess wall 206 and 208 will invert the n-type region between the bottom 208 of the recess and the p-doped region 209 into p-type, thereby electrically connecting the p-doped region 209 to the conductive material included in the recess. In addition, diffusing the p-type dopant in the walls of the recess creates a depletion region between the recess and the substrate in addition to the depletion region in the epitaxial layer, thereby electrically isolating the individual microcell.

In some embodiments, the conductive material 204 filling the recess may include a metal. When the conductive material 204 includes a metal, sides 206 of the recess in the n-type semiconductor substrate 202 may include an electrically insulating material (not shown) disposed thereon. The bottom 208 of the recess, however, may not include any electrically insulating material.

Further, the recess defined by the n-type semiconductor substrate 202 includes a portion of the n-type semiconductor substrate 202 between the bottom 208 of the recess and the second side of the n-type semiconductor substrate 202. That is, the recess does not pass through the n-type semiconductor substrate 202. When the recess is filled with a conductive material, the portion of the n-type semiconductor exists between the top of the conductive material and the second side of the n-type semiconductor substrate. The thickness of this portion of the n-type semiconductor substrate 202 may be about 0.2 microns to 10 microns thick.

For the cell 200, the second region 214 (n-type) of the n-type epitaxial layer 210 and the first region 212 (p-type) of the n-type epitaxial layer 210 form a p-n junction. The second region 214 of the n-type epitaxial layer 210 is thin such that incident photons can penetrate through the second region 214 and be absorbed in the first region of the n-type epitaxial layer 210.

Figure 3:
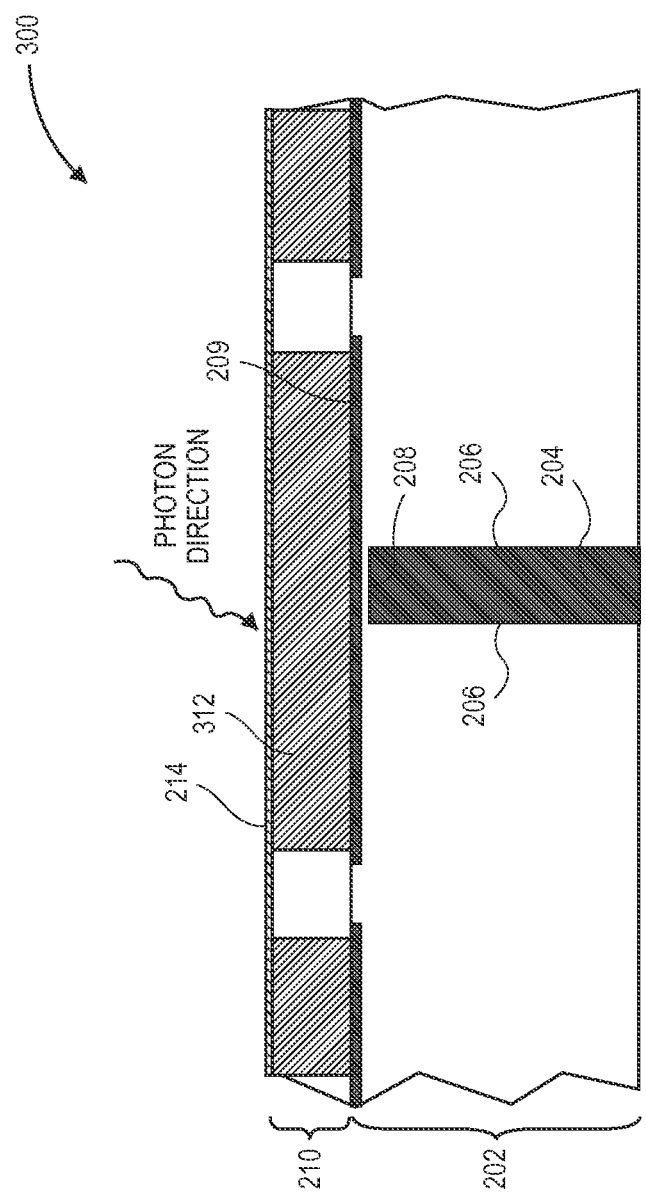
FIG. 3 shows an example of a cross-sectional schematic illustration of a cell of a back-side readout semiconductor PM with a n-type semiconductor substrate.

FIG. 3 shows an example of a cross-sectional schematic illustration of a cell of a back-side readout semiconductor PM with a n-type semiconductor substrate. The cell 300 shown in FIG. 3 may be similar to the cell 200 shown in FIG. 2, with the first region 312 of the n-type epitaxial layer 210 being n-doped and not p-doped (i.e., as in first region 212, which is p-doped). With the cell 300, a high electric field is located near the bottom of the n-type epitaxial layer 210, where the first region 312 (n-type) meets p-doped region 209 of the n-type substrate 202.

During an avalanche process and breakdown, there are visible light photons emitted. There are, on average, about three photons emitted for every about $10^5$ generated carriers [18], [19]. These photons can propagate to a neighboring cell, triggering an avalanche breakdown, which is known as optical crosstalk. For the cells in some back-side readout semiconductor PMs (e.g., the cell 100 shown in FIG. 1), the cell may naturally suppress the crosstalk originating in the bulk due to the low-field p-n junction below the n-doped region of the p-type semiconductor substrate. However, crosstalk can still originate in the avalanche region (e.g., the first region of the p-type epitaxial layer of the cell 100), triggering an avalanche breakdown.

Figure 4:
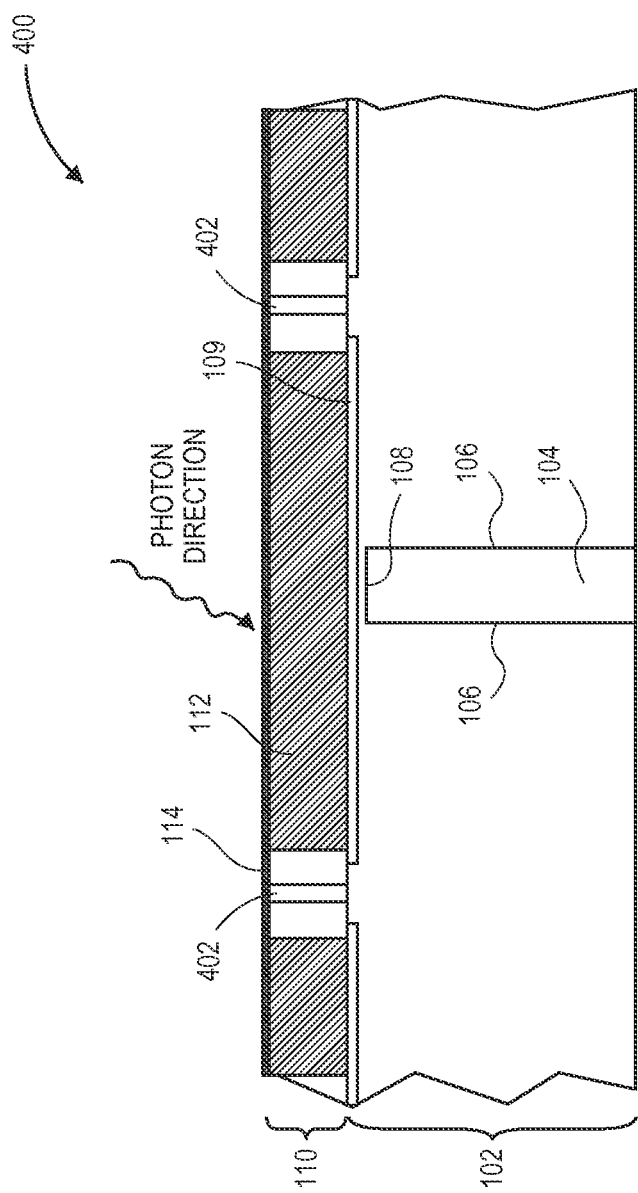
FIG. 4 shows an example of a cross-sectional schematic illustration of a cell of a back-side readout semiconductor PM with a p-type semiconductor substrate.

FIG. 4 shows an example of a cross-sectional schematic illustration of cell of a back-side readout semiconductor PM with a p-type semiconductor substrate. The cell 400 shown in FIG. 4 may be similar to the cell 100 shown in FIG. 1, with the addition of the trenches 402 in the p-type epitaxial layer 110. The trenches 402 may be formed between cells that are fabricated on the same p-type semiconductor substrate. The trenches 402 may surround the cell 100, in a top-down view (not shown) of the cell 100. The trenches 402 may reduce the optical crosstalk between adjacent cells. The trenches may be filled with silicon dioxide or with a metal. In addition, the surfaces of the trenches may be passivated with higher p-type doping to reduce surface generated carriers [20]. The trenches are placed far enough from the first region 112 of the p-type epitaxial layer 110 so that the field at the edge of first region 112 is lower than the field at the high-field junction. Simulations show that a distance of about 1 to 3 microns between the first region 112 and the edge of the cell 100 is sufficient enough to avoid premature breakdown at the edge. Trenches may also be implemented between cells 200 shown in FIG. 2 or cells 300 shown in FIG. 3.

Trenches may be fabricated after the epitaxial layer is deposited. As shown in FIG. 4, the second region 114 of the p-type epitaxial layer 110 overlies the trenches. This may be the configuration when the second region 114 is deposited on the p-type epitaxial layer 110. In some other implementations, the trenches may not be covered by the second region 114 of the p-type epitaxial layer 110.

Figure 5:
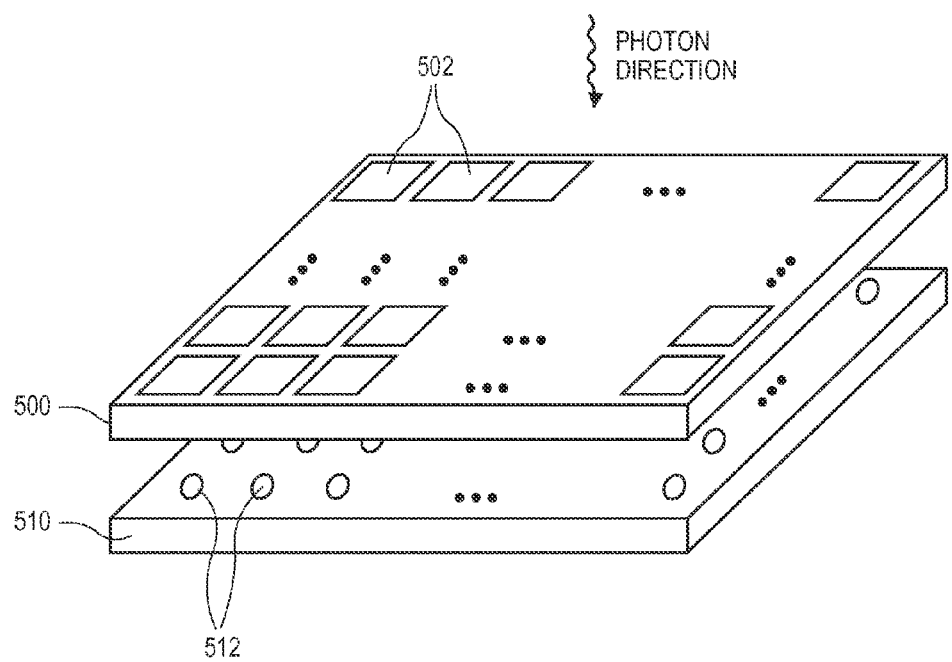
FIG. 5 shows an example of a schematic illustration of a back-side readout semiconductor PM and a readout ASIC.

FIG. 5 shows an example of a schematic illustration of a back-side readout semiconductor PM and a readout ASIC. A semiconductor PM 500 includes a plurality of cells 502, which may be cells 100, cells 200, cells 300, or cells 400, described above with respect to FIG. 1, FIG. 2, FIG. 3, and FIG. 4. Passive and/or active circuitries (not shown) can be implemented on the back side of the semiconductor PM 500 or on an ASIC 510 for signal processing (analog and/or digital) without affecting the PDE. Quenching circuitry, for example, can be implemented to stop the avalanche breakdown and recharge a cell. Additionally, the spacing between the cells can be small to maximize the PDE. The spacing between cells may be about 1 micron to 10 microns, and each cell may be about 10 microns to 100 microns square. Metal pads (not shown) on the back side of the semiconductor PM 500 may be associated with the conductive material of each cell 500. The metal pads may be joined, by bump bonding, for example, to metal pads 512 on the ASIC 510. Using a separate semiconductor PM and ASIC, as shown in FIG. 5, allows the semiconductor PM and the ASIC to be separately fabricated, which may reduce cost. A semiconductor PM may have a size of about 1 mm by 1 mm (1 mm$^2$) to 10 mm by 10 mm (100 mm$^2$), or about 3 mm by 3 mm (9 mm$^2$). Such a semiconductor PM may include tens, hundreds, or thousands of cells.

Figure 6:
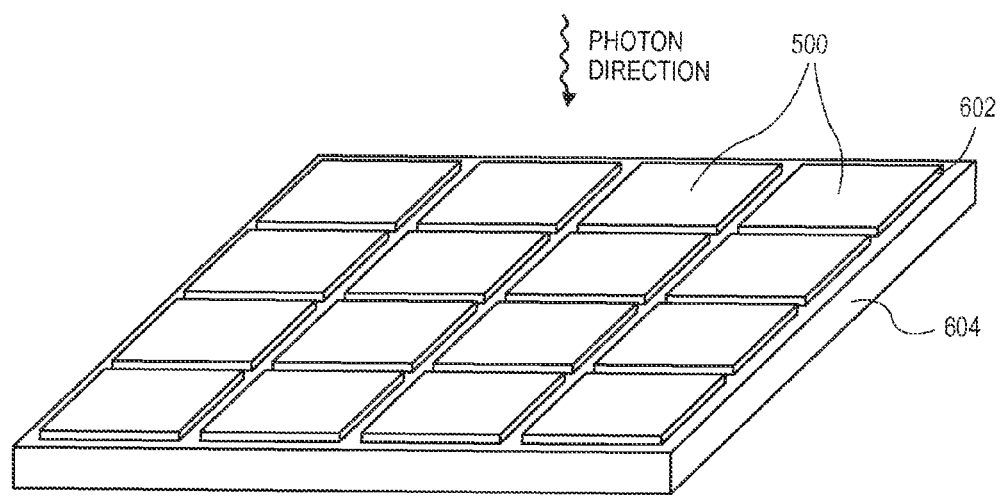
FIG. 6 shows an example of a schematic illustration of an array of back-side readout semiconductor PMs and a large area readout ASIC.

FIG. 6 shows an example of a schematic illustration of an array of back-side readout semiconductor PMs and a large area readout ASIC. The array assembly 602 may include a plurality of semiconductor PMs 500 to form a large detection area, each of which may be in electrical contact with a large area readout ASIC 604. The array assembly 602 includes 16 (in a 4 by 4 arrangement) semiconductor PMs 500. The array assembly 602, however, may include any number of and arrangement of semiconductor PMs 500, such as 4 (e.g., 2 by 2), 9 (e.g., 3 by 3), or 64 (e.g., 8 by 8) semiconductor PMs 500. The array assembly 600 may be fabricated from a monolithic semiconductor or tiled together from individually fabricated semiconductor PMs.

In use, when an array of semiconductor PMs is coupled to a scintillator, the scintillation light is spread over a number of semiconductor PMs. In order to reduce the number of readout channels (as is commonly done in single-photon emission computed tomography (SPECT) and positron emission tomography (PET)), the readout ASIC can incorporate additional circuitry that uses the appropriate ratios of the signals from the semiconductor PMs in the array to calculate the three dimensional position of the interaction of the photon in the scintillator. This may reduce the output of the readout ASIC to four analog outputs or four digital outputs (e.g., one for the sum of semiconductor PM signals and three for the coordinate of the positions).

EXPERIMENTAL

All process and device simulations were performed on a back-side readout SiPM having a n+ column readout, a p-type silicon substrate, and a p-type silicon epitaxial layer. Some simulations were performed using Technology Computer-Aided Design (TCAD) tools from Synopsys (Mountain View, Calif.) [9] to determine the electrical and optical properties of this structure. Unless otherwise stated, the simulations were performed in 2-D at room temperature and on half of a microcell.

A. Doping Profile and Depletion Region

In the simulation, a negative bias voltage was applied to the p+ contact (e.g., the second region 114 of the p-type epitaxial layer 110 in the cell 100, shown in FIG. 1) from zero to −40 V. The avalanche region of the p-n junction is fully depleted below −20 V. The depletion region extended across the epitaxial layer encompassing the n+ anode (e.g., the n-doped region 109 of the p-type semiconductor substrate 102 in the cell 100, shown in FIG. 1) all the way down the n-type column (e.g., the conductive material 104) to the bottom surface isolating the individual microcell. On the back side, a layer of $SiO_2$ was deposited on the surface between the n+ polysilicon electrodes. This oxide layer contains trapped positive charges, which can attract electrons to the Si—$SiO_2$ interface shorting the electrodes together. Because SiPM devices are often used in radiation detection applications in the presence of ionizing radiation, this fixed positive oxide charge tends to increase with ionizing radiation eventually saturating at a density of about $10^{12}$ $cm^{-2}$ [12]. A common approach to interrupting this electron layer is to use a p-type implant between the n+ columns, which is also known as a p-stop [13], [14].

In the simulation, the microcell size was about 40 microns by 40 microns, and the gap between the p implant and the edge of the microcell was about 2 microns, yielding a fill factor of about 90%. The fill factor may be greater than about 90% as the microcell size increases because the gap between the p implant and the edge of the microcell remains at about 2 microns.

B. Electric Field

An electric field profile of the front side of a back-side readout SiPM showed that the high-field region at the p-n junction was confined to the p-type region, which was slightly smaller in size than the n+ region. This structure decreased the field at the edges to prevent premature breakdown. Since the p-n junction wraps around the n+ region, there was a low-field junction surrounding the rest of the n+ region because of the lower background doping. Therefore, free carriers generated from the bulk crossing through the low-field junction may not contribute to the dark count rate.

The simulation showed that the field at the edge was about 27% lower than the high-field region at the p-n junction. However, the simulation was performed in 2-D, which implies that the calculated field at the edge may be more representative of a cylindrical junction. In a real 3-D device, the corner of the junction may be a spherical region. Since a spherical region of a junction has a higher field intensity than a cylindrical region, the calculated field at the edge may be extrapolated to a spherical junction to validate that the field at the corner in a 3-D device is still low enough to prevent premature breakdown. Simple numerical calculations imply that the increase in the fields from a cylindrical junction to a spherical junction [15] is low enough to prevent premature breakdown for reasonable values of the ratio of the radius of curvature of the junction to the depletion width that represents the edge junction of the simulated structure. In addition, preliminary 3-D simulations appear to validate that the fields at the corners are low enough to prevent premature breakdown.

C. I-V and C-V Characteristics

Figure 7:
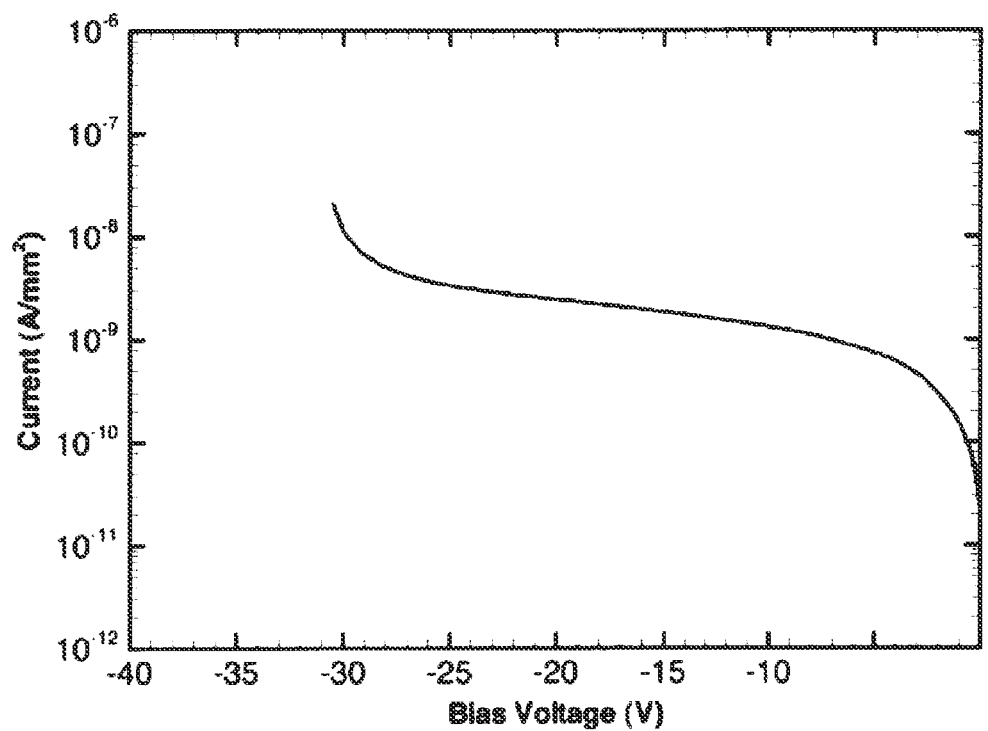
FIG. 7 shows a plot of the I-V characteristic of a back-side readout SiPM.
Figure 8:
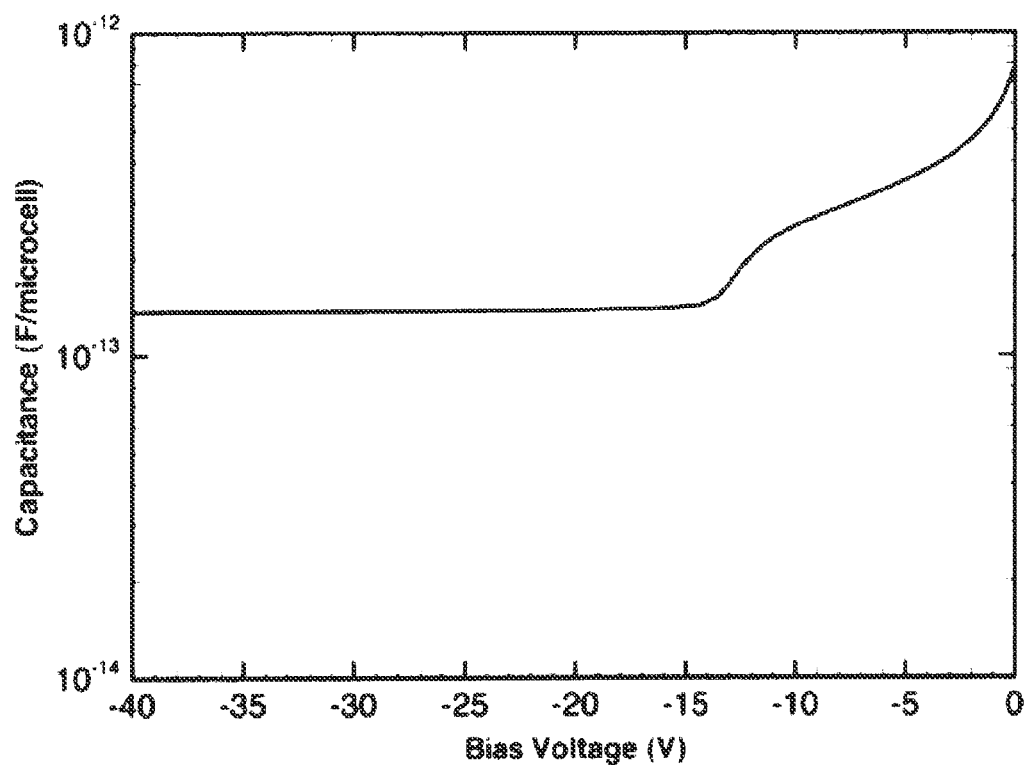
FIG. 8 shows a plot of the C-V characteristic of a back-side readout SiPM.

FIG. 7 and FIG. 8 show the leakage current and capacitance, respectively, as a function of the bias voltage. The leakage is reported as amperes per square millimeter, and the capacitance is for one microcell. The breakdown voltage was about −30 V. The calculated breakdown voltage may be underestimated because the local field model used in the simulation predicts higher impact ionization rates [16].

The capacitance was calculated to be about 130 femtofarads (fF), which is consistent with a depletion depth of about 1.2 microns and a microcell area of about 40 microns by 40 microns.

D. Quantum Efficiency (QE)

In the QE simulation, a non-structured version of the back-side SiPM was used. Therefore, the calculated QE does not include the loss due to the fill factor as well as the loss due to the probability of triggering an avalanche breakdown, which is dependent on the overvoltage and the position where the primary carriers are generated [17]. The simulation was performed with no avalanche model, and thus, the QE was estimated by taking the ratio of the collected anode current to the source photo current. Only the generated carriers in the epitaxial layer contribute to the anode current because these carriers would trigger avalanche breakdowns. The carriers generated in the substrate are ignored because they would not enter the high field region and thus cannot trigger avalanche breakdowns. In addition, the effect of the p+ contact thickness on the front surface of the device on the QE was studied.

Figure 9:
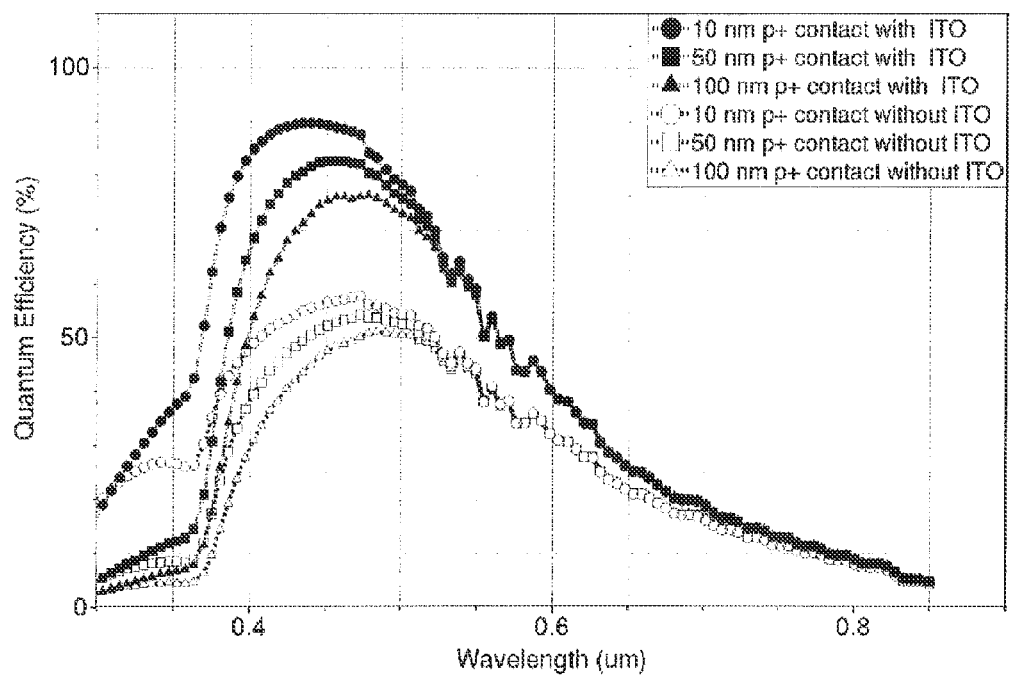
FIG. 9 shows a plot of quantum efficient (QE) versus wavelength of a back-side readout SiPM for varying p+ contact thicknesses with and without antirelective (AR) coatings.

FIG. 9 shows two sets of curves for three different thicknesses of the p+ contact (ranging from about 10 nm to 100 nm), one with no antireflective (AR) coating and one with indium tin oxide (ITO) as the AR coating. An advantage of using ITO is that it is conductive and can be applied across the whole front surface. The thickness of the ITO layer is optimized for 420 nm to maximize the QE for the light emission of lutetium oxyorthosilicate (LSO). At longer wavelengths, the QE decreases rapidly because the depletion depth of the active region is about 1.2 microns. At shorter wavelengths, the QE decreases with increasing thickness of the p+ contact due to carrier recombination loss in the p+ layer. As expected, the QE was improved significantly with the AR coating.

REFERENCES

[1] Z. Y, Sadygov, I. M. Zheleznykh, N. A. Matakhov, V. N. Jejer, and T. A. Kirillova, "Avalanche semiconductor radiation detectors," *IEEE Trans. Nucl. Sci.*, vol. 43, no. 3, pp. 1009-1013, June 1996.

[2] P. Buzhan, B. Dolgoshein, A. Ilyin, V. Kantserov, V. Kaplin, A. Karakash, A. Pleshko, E. Popova, S. Smirnov, and Y. Volkov, "An advanced study of silicon photomultiplier," *ICFA Instrum. Bull.*, vol. 23, pp. 28-41, 2001.

[3] V. Saveliev, "The recent development and study of silicon photomultiplier,"*Nucl. Instrum. Methods Phys. Res. A*, vol. 535, pp. 528-532, 2004.

[4] C. J. Stapels, W. G. Lawrence, F. L. Augustine, and J. F. Christian, "Characterization of a CMOS Geiger photodiode pixel," *IEEE Trans. Electron Devices*, vol. 53, no. 4, pp. 631-635, April 2006.

[5] Y. Musienko, "Advances in multipixel Geiger-mode avalanche photodiodes (silicon photomultipliers)," *Nucl. Instrum. Methods Phys. Res. A*, vol. 598, pp. 213-216, 2009.
[6] T. Frach, G. Prescher, C. Degenhardt, R. de Gruyter, A. Schmitz, and R. Ballizany, "The digital silicon photomultiplier—Principle of operation and intrinsic detector performance," in *Proc. IEEE Nucl. Sci. Symp. Conf. Rec.*, 2009, pp. 1959-1965.
[7] G. Q. Zhang, X. B. Hu, C. Z. Hu, D. P. Yin, K. Liang, R. Yang, and D. J. Han, "Demonstration of a silicon photomultiplier with bulk integrated quenching resistors on epitaxial silicon," *Nucl. Instrum. Methods Phys. Res. A*, vol. 621, no. 1-3, pp. 116-120. September 2010.
[8] J. Ninkovic, L. Andricek, C. Jendrisyk, C. Liemann, C. Lutz, H.-G. Moser, R. Richter, and F. Schopper, "The first measurements on SiPMs with bulk integrated quench resistors," *Nucl. Instrum. Methods Phys. Res. A*, vol. 628, no. 1, pp. 407-410, February 2011.
[9] [Online publication]
[10] C. Kenney, S. Parker, J. Segal, and C. Storment, "Silicon detectors with 3-D electrode arrays: Fabrication and initial test results," *IEEE Trans. Nucl. Sci.*, vol. 46, no. 4, pp. 1224-1236, August 1999.
[11] G. Pellegrini, M. Lozano, M. Ullan, R. Bates, C. Fleta., and D. Pennicard, "First double-sided 3-D detectors fabricated at CNM-IMB," *Nucl. Instrum. Methods Phys. Res. A*, vol. 592, no, 1/2, pp. 38-43, July 2008.
[12] T. P. Ma and P. V. Dressendorfer, *Ionizing Radiation Effects in MOS Devices and Circuits*. New York: Wiley, 1989.
[13] R. H. Richter, "Strip detector design for ATLAS and HERA-B using two dimensional device simulation," *Nucl. Instrum. Methods Phys, Res. A*, vol. 377, no. 2/3, pp. 412-421, August 1996.
[14] Y. Iwata, "Optimal p-stop pattern for the n-side strip isolation of silicon microstrip detectors," *IEEE Trans. Nucl. Sci.*, vol. 45, no. 3, pp. 303-309, June 1998.
[15] S. M. Sze and K. K. Ng, *Physics of Semiconductor Devices*, 3rd ed. New York: Wiley, 2007.
[16] N. Serra, G. Giacomini, A. Piazza, C. Piemonte, A. Tarolli, and N. Zorzi, "Experimental and TOAD study of breakdown voltage temperature behavior in n+/p SiPMs," *IEEE Trans. Nucl. Sci.*, vol. 58, no. 3, pp. 1233-1240, June 2011.
[17] W. G. Oldham, R. R. Samuelson, and P. Antognetti, "Triggering phenomena in avalanche diodes," *IEEE Trans. Electron Devices*, vol. ED-19, no. 9, pp. 1056-1060, September 1972.
[18] A. Lacaita, F. Zappa, S. Bigliardi, and M. Manfredi, "On the bremsstrahlung origin of hot-carrier-induced photons in silicon devices," *IEEE Trans. Electron Devices*, vol. 40, no. 3, pp. 577-582, March 1993.
[19] R. Mirzoyan, R. Kosyra, and H.-G. Moser, "Light emission in Si avalanches," *Nucl. Instrum. Methods Phys. Res. A*, vol. 610, no. 1, pp. 98-100, 2009.
[20] M. Gersbach, J. Richardson, E. Mazaleyrat, S. Hardillier, C. Niclass, R. Henderson, L. Grant, and E. Charbon, "A low-noise single-photon detector implemented in a 130 nm CMOS imaging process," *Solid State Electron.*, vol. 53, no. 7, pp. 803-808, July 2009.

It is to be understood that the above description and examples are intended to be illustrative and not restrictive. Other embodiments will be apparent to those of ordinary skill in the art upon reading the above description and examples. The scope of the embodiments should, therefore, be determined not with reference to the above description and examples, but should instead be determined with reference to the appended claims, along with the full scope of equivalents to which such claims are entitled.

What is claimed is:

1. A device comprising:
a p-type semiconductor substrate, the p-type semiconductor substrate having a first side and a second side, the first side of the p-type semiconductor substrate defining a recess, the second side of the p-type semiconductor substrate being doped with n-type ions;
a conductive material disposed in the recess; and
a p-type epitaxial layer disposed on the second side of the p-type semiconductor substrate, the p-type epitaxial layer including:
a first region proximate the p-type semiconductor substrate, the first region being implanted with p-type ions at a higher doping level than the p-type epitaxial layer, and
a second region disposed on the first region, the second region being doped with p-type ions at a higher doping level than the first region.

2. The device of claim 1, wherein the recess has a columnar shape.

3. The device of claim 1, wherein the recess has an aspect ratio of about 1 to 30 or greater.

4. The device of claim 1, wherein the recess has a diameter of about 5 microns to 100 microns.

5. The device of claim 1, wherein the p-type semiconductor substrate is selected from the group consisting of silicon and gallium arsenide.

6. The device of claim 1, wherein the p-type epitaxial layer is selected from the group consisting of silicon and gallium arsenide.

7. The device of claim 1, wherein the conductive material is selected from the group consisting of n-type polysilicon and n-type polycrystalline gallium arsenide.

8. The device of claim 1, wherein the conductive material includes a metal.

9. The device of claim 8, further comprising:
an electrically insulating layer disposed on surfaces of the recess substantially perpendicular to the first side of the p-type semiconductor substrate.

10. The device of claim 1, wherein the p-type semiconductor substrate is about 20 microns to 600 microns thick.

11. The device of claim 1, wherein the p-type epitaxial layer is about 1 micron to 5 microns thick.

12. The device of claim 1, further comprising:
an antireflective layer disposed on the p-type epitaxial layer.

13. The device of claim 1, wherein a portion of the p-type semiconductor substrate between the conductive material and the second side of the p-type semiconductor substrate is about 0.2 microns to 10 microns thick.

14. A device comprising:
a n-type semiconductor substrate, the n-type semiconductor substrate having a first side and a second side, the first side of the n-type semiconductor substrate defining a recess, the second side of the n-type semiconductor substrate being implanted with p-type ions;
a conductive material disposed in the recess; and
a n-type epitaxial layer disposed on the second side of the n-type semiconductor substrate, the n-type epitaxial layer including:
a first region proximate the n-type semiconductor substrate, the first region being implanted with p-type ions, and
a second region disposed on the first region, the second region being implanted with n-type ions.

15. The device of claim 14, wherein the conductive material is selected from the group consisting of p-type polysilicon and p-type polycrystalline gallium arsenide.

16. The device of claim 14, wherein the conductive material includes a metal, the device further including:
an electrically insulating layer disposed on surfaces of the recess substantially perpendicular to the first side of the n-type semiconductor substrate.

17. An apparatus comprising:
a first device, the first device including:
a p-type semiconductor substrate, the p-type semiconductor substrate having a first side and a second side, the first side of the p-type semiconductor substrate defining a recess, the second side of the p-type semiconductor substrate being implanted with n-type ions,
a conductive material disposed in the recess, and
a p-type epitaxial layer disposed on the second side of the p-type semiconductor substrate, the p-type epitaxial layer including:
a first region proximate the p-type semiconductor substrate, the first region being implanted with p-type ions at a higher doping level than the p-type epitaxial layer, and
a second region disposed on the first region, the second region being implanted with p-type ions at a higher doping level than the first region; and
an application-specific integrated circuit coupled to the first side of the p-type semiconductor substrate and in electrical contact with the conductive material of the first device.

18. The apparatus of claim 17, further comprising:
a plurality of devices, the first device being one of the plurality of devices, wherein the application-specific integrated circuit is in electrical contact with the conductive material of each of the plurality of devices.

* * * * *